United States Patent [19]

Kihara et al.

[11] 4,404,659
[45] Sep. 13, 1983

[54] PROGRAMMABLE READ ONLY MEMORY

[75] Inventors: Toshimasa Kihara, Tachikawa; Toshifumi Inoue, Kodaira, both of Japan

[73] Assignee: Hitachi, Ltd., Tokyo, Japan

[21] Appl. No.: 193,411

[22] Filed: Oct. 3, 1980

[30] Foreign Application Priority Data

Oct. 5, 1979 [JP] Japan ............................ 54-127913

[51] Int. Cl.³ ............................................. G11C 11/40
[52] U.S. Cl. ..................................... 365/185; 365/189
[58] Field of Search ....................... 365/184, 185, 189

[56] References Cited

U.S. PATENT DOCUMENTS

| | | | |
|---|---|---|---|
| 3,836,894 | 9/1974 | Cricchi | 365/184 |
| 4,301,518 | 11/1981 | Klaas | 365/185 |

FOREIGN PATENT DOCUMENTS

| | | | |
|---|---|---|---|
| 813537 | 5/1969 | Canada | 365/185 |
| 2445078 | 4/1976 | Fed. Rep. of Germany | 365/185 |
| 2306504 | 12/1976 | France | 365/185 |

*Primary Examiner*—Stuart N. Hecker
*Attorney, Agent, or Firm*—Antonelli, Terry & Wands

[57] ABSTRACT

A programmable read only memory consists of a plurality of FAMOS's having a control gate. Control gates of the plurality of FAMOS's arrayed along the same row are commonly connected to a word line, and drains of the plurality of FAMOS's arrayed along the same column are commonly connected to a bit line. Sources of the plurality of FAMOS's are commonly connected, and are connected to a ground point of the circuit via resistance means. Bit lines which are selected when the data is to be written are provided with a high voltage. Floating gates of the non-selected FAMOS's are coupled by parasitic capacity which exists between the floating gate and the drain. Therefore, when the voltage of the bit line is raised, the voltage of the floating gate is undesirably raised correspondingly. In this case, however, voltage drops across said resistance means owing to the writing current which flows through the selected FAMOS, and the potential of the commonly connected sources is raised by the drop in the voltage. Consequently, the non-selected FAMOS's are properly maintained in the non-conductive state despite the fact that the potential of the floating gate is raised as mentioned above.

9 Claims, 6 Drawing Figures

PROGRAMMABLE READ ONLY MEMORY

BACKGROUND OF THE INVENTION

The present invention relates to a programmable read only memory (hereinafter referred to as programmable ROM), and particularly to a programmable ROM employing semi-conductor non-volatile memory elements.

Conventionally known semiconductor non-volatile memory elements can be represented by floating gate avalanche injection MOS transistors (hereinafter referred to as memory MISFET's) in which a control gate is laminated on a floating gate via an insulating film.

A programmable ROM is formed by arraying, for example, a plurality of the above-mentioned memory MISFET's in the form of a matrix. Drains of the plurality of memory MISFET's arrayed along the same row are commonly connected to a bit line for writing and reading data, and control gates of the memory MISFET's arrayed along the same column are commonly connected to a word line.

A relatively high voltage is applied to selected bit lines to write the data, and a high voltage is also applied to the selected word lines. Accordingly, hot carriers are injected into floating gates of the memory MISFET's which correspond to the selected bit lines and word lines. In other words, the data is written in the selected memory MISFET's.

With reference to the non-selected memory MISFET's, in this case, parasitic capacity will arise between the drains and the floating gates. Therefore, when the potential of the drain is raised by the rise in the potential of the bit line, the potential of the floating gate is raised correspondingly. Consequently, the non-selected memory MISFET's are rendered slightly conductive despite the fact that the potential of the control gate is of the low level. Namely, a leakage current flows from the selected bit lines to the non-selected memory MISFET's. In other words, the writing current produced by the writing means is partly permitted to flow as the leakage current.

When the voltage applied to the bit lines is raised excessively, on the other hand, the non-selected memory MISFET's operate in the negative resistance region due to the high voltage, and this imposes the probability of breakage.

SUMMARY OF THE INVENTION

The principal object of the present invention, therefore, is to provide a programmable ROM which does not permit the leakage current to flow into the non-selected memory MISFET's when the data is being written into the selected MISFETs.

Another object of the present invention is to provide a programmable ROM which does not allow the memory MISFET's to be broken when the data is being written therein.

A further object of the present invention is to provide a novel programmable ROM which includes simply constructed means for preventing the leakage current.

Yet further objects of the present invention will become obvious from the following description taken in conjunction with the accompanying drawings.

According to the present invention, a predetermined voltage is applied to common sources of the memory MISFET's at least when the data is being written. With the voltage of the common source being suitably set, the selected memory MISFET's are rendered conductive, i.e., the memory MISFET's which are provided with a relatively high selection voltage via the control gates are rendered conductive. Consequently, the floating gates of the selected memory MISFET's are provided with the writing voltage through the drain, i.e., provided with the electric charge which forms the data.

On the other hand, the memory MISFET's which are not selected are properly maintained in a non-conductive state since their control gates assume the low level such as of ground potential of the circuit and since their sources are provided with the above-mentioned potential.

The voltage to be applied to the common source can be generated by voltage generator means such as a voltage divider, or can also be generated by providing a resistor element between the common source and the ground point of the circuit, and passing the source current of the selected memory MISFET's to the resistor element. The setup for generating the source voltage can be simply constructed relying upon the above-mentioned resistor elements, and can be easily put into practice.

According to the present invention, MISFET's of the depletion mode can be preferably used as variable resistor elements instead of the above-mentioned resistor elements.

DESCRIPTION OF THE PREFERRED EMBODIMENT

The invention will now be explained below in detail with reference to an embodiment.

Figure 1:
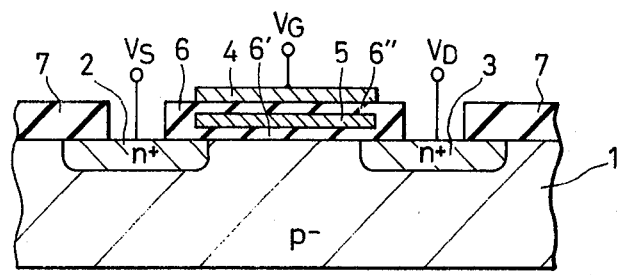
FIG. 1 is a cross-sectional view illustrating the construction of a memory MISFET.

FIG. 1 illustrates a memory MISFET in cross section, in which reference numeral 1 denotes a P-type silicon semiconductor substrate, and 2 and 3 denote an N-type source region and an N-type drain region, respectively, that are formed on the surface of the semiconductor substrate 1.

Reference numeral 5 denotes a floating gate composed of polycrystalline silicon which is formed on the surface of the semiconductor substrate 1 between the source region 2 and the drain region 3 via a thin gate oxide film 6' which is composed of silicon dioxide, and 5 denotes a control gate which is formed on the floating gate 5 via a thin oxide film 6". Reference numeral 7 denotes a thick field oxide film which is formed on the surface of the semiconductor substrate 1.

Here, a ground wire is brought into contact with the front surface or the back surface of the semiconductor substrate so that it is maintained at the ground potential of the circuit.

Figure 5:
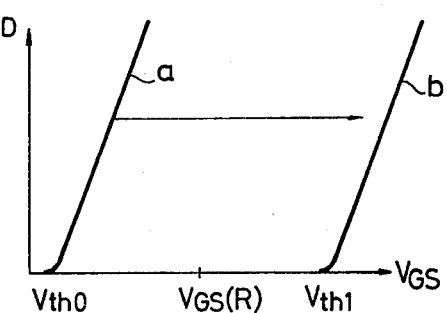
FIG. 5 is a diagram of operation characteristics curves of the memory MISFET.

The memory MISFET assumes two-value characteristics depending upon whether the electrons are injected into the floating gate 5, as indicated by two curves a and b of FIG. 5 which represent control gate voltage $V_{GS}$ vs. drain current $I_D$ characteristics.

Namely, when the electrons are not injected into the floating gate 5, the memory MISFET acquires a relatively low threshold voltage $V_{th0}$ as indicated by the curve a of FIG. 5.

When a relatively high voltage is applied to the control gate 4 and the drain 3 of FIG. 1, hot electrons are generated in the vicinity of the drain 3 and are injected into the floating gate 5 via the thin gate oxide film 6'.

When the electrons are injected into the floating gate 5 as mentioned above, the memory MISFET acquires a large threshold voltage $V_{th1}$ as indicated by the curve b of FIG. 5.

Figure 2:
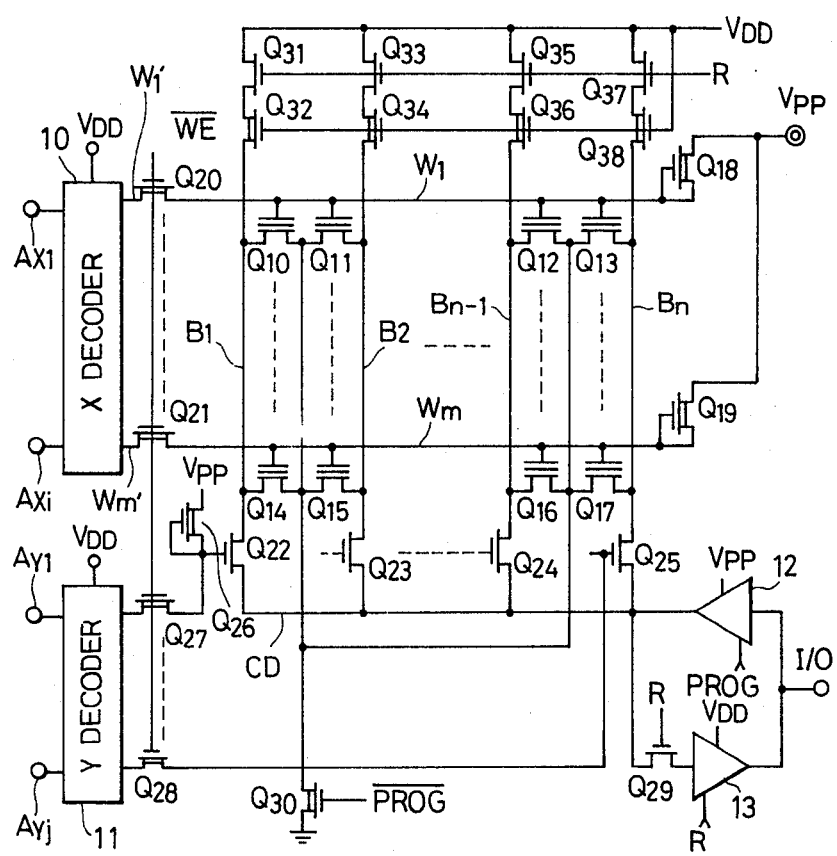
FIG. 2 is a circuit diagram of a programmable ROM according to an embodiment of the present invention.

FIG. 2 is a circuit diagram of the programmable ROM according to the embodiment of the present invention. The circuit of FIG. 2 is formed on a semiconductor substrate together with an input buffer circuit which is not shown and together with a control circuit of FIG. 3, by a commonly known semiconductor integrated circuit technique.

Referring to FIG. 2, symbols $Q_{10}$ to $Q_{17}$ denote memory MISFET's which are arrayed in the form of a matrix.

Control gates of the memory MISFET's $Q_{10}$ to $Q_{13}$ arrayed along the same row or arrayed, for example, along the first row, are commonly connected to a word line $W_1$.

Similarly, control gates of the memory MISFET's $Q_{14}$ to $Q_{17}$ arrayed along the bottom row are commonly connected to a word line $W_m$.

Further, drains of the memory MISFET's $Q_{10}$, $Q_{14}$ which are arrayed along the same column, for example, along the first column, are commonly connected to a bit line $B_1$, and drains of the memory MISFET's $Q_{11}$, $Q_{15}$, $Q_{12}$, $Q_{16}$, $Q_{13}$, $Q_{17}$ arrayed along other columns are also commonly connected to their corresponding bit lines $B_2$ to $B_n$.

Although not specifically restricted, the source regions of the neighbouring MISFET's $Q_{10}$, $Q_{11}$, $Q_{14}$, $Q_{15}$ along the bit columns are formed as a common semiconductor region in order to increase the degree of integration.

Depletion type MISFET's $Q_{18}$, $Q_{19}$ which serve as high resistance elements are connected between the individual word lines $W_1$ to $W_m$ and a high-voltage terminal $V_{pp}$ for effecting writing.

Referring to FIG. 2 and the other drawings, the depletion-type MISFET's as denoted by $Q_{18}$ and $Q_{19}$ have a wire which is connected across the source and the drain, and are therefore represented by a symbol which is different from that of the enhancement-type MISFET which is denoted, for example, by $Q_{29}$.

Reference numeral 10 denotes an X-address decoder circuit. The X-address decoder circuit 10 operates on a power supply voltage of, for example, +5 volts which is applied to a power supply terminal $V_{DD}$.

Only one of a plurality of output lines $W_1'$ to $W_m'$ of the X-address decoder circuit 10 is selected so as to acquire a high level which is nearly equal to the power supply voltage, depending upon a combination of address input signals consisting of a plurality of bits that are fed to address input terminals $A_{x1}$ to $A_{xi}$. The output lines which are not selected, on the other hand, assume a low level which is nearly equal to the ground potential of the circuit.

Figure 4:
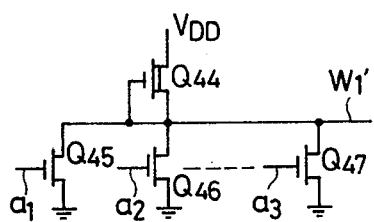
FIG. 4 is a diagram of a decoder circuit.

FIG. 4 illustrates in detail a circuit for selecting the output line $W_1'$ of the X-address decoder circuit 10.

This circuit consists of enhancement-type MISFET's $Q_{45}$ to $Q_{47}$ which receive, through terminals $a_1$ to $a_3$, address input signals that are fed to the address input terminals $A_{x1}$ to $A_{xi}$, and a depletion-type load MISFET $Q_{44}$ of which the gate and source are connected to each other.

Owing to the connection as diagrammatized, NOR logic signals of signals applied to the terminals $a_1$ to $a_3$ are produced on the output line $W_1'$. Therefore, the output line $W_1'$ is selected when all of the address input signals consisting of a plurality of bits fed to the terminals $a_1$ to $a_3$ are of the low level. Here, the output line $W_1'$ is not selected when at least one of the address input signals consisting of the plurality of bits is of the high level.

In reading the data from the memory MISFET's of FIG. 2, word lines which are to be selected from the word lines $W_1$ to $W_m$ must assume the high level which is nearly equal to the level of the X-address decoder circuit 10, and word lines which are not selected must assume the low level which is nearly equal to the ground potential of the circuit.

In writing the data in the memory MISFET's, on the other hand, the selected word lines must assume a level which is as high as +25 volts, which is considerably higher than the high-level output of the X-address decoder circuit 10, and the non-selected word lines must assume the level which is nearly equal to the ground potential of the circuit.

According to this embodiment, the output line $W_1'$ is coupled to the word line $W_1$ via a depletion-type MISFET $Q_{20}$, and the output line $W_m'$ is coupled to the word line $W_m$ via a depletion-type MISFET $Q_{21}$, such that the word line selected by the output of the X-address decoder circuit 10 will acquire the above-mentioned high voltage when the data is being written. These MISFET's $Q_{20}$ and $Q_{21}$ are controlled by a write control signal which is fed to a control line WE.

Figure 3:
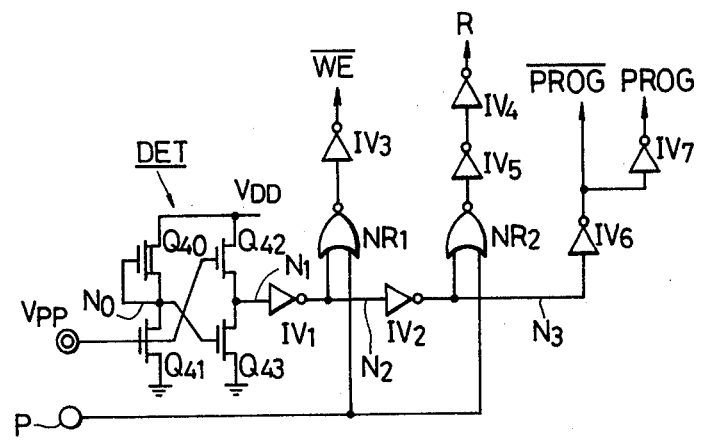
FIG. 3 is a diagram illustrating a control circuit which feeds signals to the circuit of FIG. 1.

The write control signal in the control line WE is supplied from the control circuit of FIG. 3.

When the data is being written in the memory MISFET's, the write control signal assumes the low level such as zero volt, which is much lower than the threshold voltage of the depletion-type MISFET's $Q_{20}$, $Q_{21}$, in contrast with the high-level output signal of the X-address decoder circuit 10. Even when the data is to be read out, the write control signals assumes the level of, for example, 5 volts which is nearly equal to the high-level signal of the X-address decoder circuit 10.

Therefore, if the word line $W_1$ is selected when the data is being written, the MISFET $Q_{20}$ is rendered non-conductive by the high-level signal of nearly 5 volts in the output line $W_1'$ of the X-address decoder circuit 10, and by the low-level signal of nearly zero volt in the control line WE. A writing voltage which is as high as 25 volts is applied to the terminal $V_{pp}$ while the data is being written. The depletion-type MISFET $Q_{18}$ which serves as high resistance means has been connected to the word line $W_1$. Therefore, the word line $W_1$ assumes a voltage which is as high as about 25 volts responsive to the voltage at the terminal $V_{pp}$. In this case, the MISFET $Q_{21}$ connected to the non-selected word line $W_m$ is in the conductive state since the source potential is as low as nearly zero volt, i.e., since the potential on the output line $W_m'$ of the X-address decoder circuit 10 is nearly zero volt. Accordingly, the non-selected word line $W_m$ assumes the low level of nearly zero volt responsive to the output of the X-address decoder circuit 10.

When the data is read out, the potential on the control line WE assumes the high level as mentioned above, whereby the MISFET's $Q_{20}$, $Q_{21}$ are rendered conductive irrespective of the high level or the low level at the output of the X-address decoder circuit 10. Consequently, the potential of the word line comes nearly into agreement with the output level of the X-address decoder circuit 10.

Referring to FIG. 2, each of the bit lines $B_1$ to $B_n$ is commonly connected to a data line CD via switching MISFET's $Q_{22}$ to $Q_{23}$ for selecting the bit lines, which are controlled by the output of the Y-address decoder circuit 11.

Gates of the switching MISFET's $Q_{22}$ to $Q_{25}$ (FIG. 2 illustrates the gate of MISFET $Q_{22}$ only) for selecting the bit lines are connected to the high-voltage terminal $V_{pp}$ for writing the data via a depletion-type MISFET $Q_{26}$ which also serves as high resistance means like those of the word lines $W_1$ to $W_m$. The gates of these MISFET's $Q_{22}$ to $Q_{25}$ are connected to the corresponding output lines of the Y-address decoder circuit 11 via depletion-type MISFET's $Q_{27}$, $Q_{28}$ which are controlled by the control signals of the control line WE.

Thus, the gate voltage of the switching MISFET's $Q_{22}$ to $Q_{24}$ which are served with the high voltage $V_{pp}$ assumes the selection level which is as high as 25 volts when the data is being written like the selection operation of the word lines, and assumes the selection level of as low as 5 volts when the data is being read out.

The output of a writing circuit 12 is connected to the data line CD to which are connected the bit lines $B_1$ to $B_n$ via the switching MISFET's $Q_{22}$ to $Q_{24}$, and the data line CD is connected to an input terminal of a reading circuit 13 via a transfer gate MISFET $Q_{29}$ which is controlled by a read signal introduced through a line R.

The input terminal of the writing circuit 12 and the output terminal of the reading circuit 13 are commonly connected to a data input/output terminal I/O.

The writing circuit 12 receives the writing voltage supplied to the terminal $V_{pp}$ as the power supply voltage, and is controlled for its operation by the control signals which are fed from the control circuit of FIG. 3 via a line PROG.

The writing circuit 12 is a three-value circuit which produces a high level, a low level or a floating output. When the control signal in the line PROG is of the high level, the writing circuit 12 produces a high-level signal of about 25 volts or a low-level signal of about 0 volt responsive to the data signal fed to the input/output terminal I/O, and causes the output to float when the control signal in the line PROG is of the low level.

The reading circuit 13 receives the voltage supplied to the terminal $V_{DD}$ as the power-supply voltage, and is controlled for its operation by the control signal supplied from the control circuit of FIG. 3 via the line R.

The reading circuit 13 is a three-value circuit like the above-mentioned writing circuit, and produces a high-level signal of about 5 volts or a low-level signal of about 0 volt responsive to the level of the input signal when the control signal fed to the line R is of the high level, and causes the output to float when the control signal fed to the line R is of the low level.

According to this embodiment, a depletion-type MISFET $Q_{30}$ which serves as resistance means is provided between sources of the memory MISFET's $Q_{10}$ to $Q_{17}$ and grounding point of the circuit as diagramatized in FIG. 2.

A signal of the high level of about 5 volts or of the low level of about 0 volt is fed from the control circuit of FIG. 3 to the gate of the MISFET $Q_{30}$ via the line PROG.

The control circuit of FIG. 3 consists of a writing voltage detector circuit DET, inverter circuits $IV_1$ to $IV_7$, and NOR circuits $NR_1$ and $NR_2$.

When the data is being written, the highpower-supply voltage of about 25 volts is supplied to the terminal $V_{pp}$, and when the data is being read out, the voltage of about 0 volt is supplied to the terminal $V_{pp}$. A terminal P is served with a control signal of the low level of 0 volt or a control signal of the high level of 5 volts.

By suitably selecting MISFET's $Q_{40}$ and $Q_{41}$, the detector circuit DET sends a high-level signal to the output line $N_1$ only when the high voltage is applied to the terminal $V_{pp}$.

Figure 6:
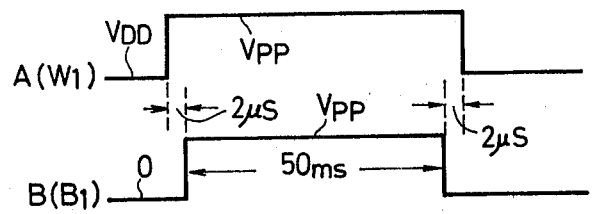
FIG. 6 is a diagram of signal waveforms in the circuit of FIG. 1.

During the writing operation, the control terminal P is maintained at the low level of about 0 volt. A memory MISFET of, for example, $Q_{10}$ is selected by address signals that are fed to address input terminals $A_{xl}$ to $A_{xi}$ and $A_{yl}$ to $A_{yj}$. Then, when a high voltage of about 25 volts is applied to the terminal $V_{pp}$, the potential of the word line $W_1$ to which is connected the gate of the MISFET $Q_{10}$ is raised to nearly 25 volts as illustrated in FIG. 6A. The writing circuit 12 is rendered operative due to the high voltage at the terminal $V_{pp}$ and the signal of the high level in the line PROG which varies responsive to the high voltage. Since the switching MISFET $Q_{22}$ is rendered conductive by the output of the Y-address decoder circuit 11, the potential of the bit line $B_1$ is raised as illustrated in FIG. 6B responsive to the output data signal of the writing circuit 12. An electric current flows from the bit line $B_1$ to the memory MISFET $Q_{10}$ which is rendered conductive by the high voltage on the word line $W_1$. Consequently, hot electrons are injected into the floating gate of the memory MISFET $Q_{10}$ whereby its characteristics change from a curve a to a curve b shown in FIG. 5. As the voltage at the terminal $V_{pp}$ returns to the low voltage of about 0 volt after a predetermined period of time has passed, the potential on the bit line $B_1$ and the potential on the word line $W_1$ decrease as shown in FIG. 6B, 6A.

During the reading operation, the potential at the terminal $V_{pp}$ is maintained at the low level of nearly 0 volt. A memory MISFET, for example, $Q_{14}$ is selected by the address signals which are supplied to address input terminals $A_{xl}$ to $A_{xi}$ and $A_{yl}$ to $A_{yj}$. Although no particular limitation is imposed, the control terminal P invariably assumes the high level, and assumes the low level when the data is to be read out. The control line R assumes the high level responsive to the low-level signal of the terminal P. A load MISFET $Q_{31}$ connected to the bit line $B_1$ is rendered conductive by the high level of the control line R. The potential on the the word line $W_m$ for selecting the memory MISFET $Q_{14}$ assumes the high level of about 5 volts. The high level on the word line $W_m$, in this case, assumes an intermediate value between a low threshold voltage $V_{th0}$ and a high threshold voltage $V_{th1}$ of the memory MISFET as indicated by $V_{GS(R)}$ in FIG. 5. Therefore, the MISFET $Q_{14}$ is rendered conductive when no electric charge is injected into the floating gate thereof, i.e., when the floating gate thereof assumes the low threshold voltage relative to the high-level signal of the word line $W_m$, and remains in the non-conductive state when the electric charge is injected into the floating gate. Correspondingly, the potential of the bit line $B_1$ assumes the high level of nearly 5 volts or the low level of nearly zero volt. The switching MISFET $Q_{22}$ is rendered conductive by the output of the Y-address decoder circuit 11, and the MISFET $Q_{29}$ is rendered conductive by the signal of the control line R. Accordingly, the data signals in the bit line $B_1$ determined by the memory data in the memory MISFET $Q_{14}$ are fed to the reading circuit 13 via the MISFET $Q_{22}$, the data line CD and the MISFET $Q_{29}$. The reading circuit 13 is actuated by the signal of the control line R, and produces a signal corresponding to the input data signal to the input/output terminal I/O.

During the above-mentioned writing operation, the control gate of the memory MISFET $Q_{14}$ assumes the low-level potential of nearly zero volt due to the non-selected word line $W_m$. The floating gate of the memory MISFET $Q_{14}$, however, is capacitatively coupled to the bit line $B_1$ via parasitic capacity (which is not diagramatized). Therefore, the potential of the floating gate rises with the rise in the potential on the bit line $B_1$.

The rising amount of the potential in the floating gate is substantially proportional to the ratio of parasitic capacity between the floating gate and the drain region to parasitic capacity between the floating gate and the control gate which is located above the floating gate.

To form the memory of a large scale, the size of the memory MISFET's is reduced by reducing, for example, the channel length of the memory MISFET's. In this case, the capacity between the floating gate and the control gate decreases, and the potential of the floating gate increases in a large quantity.

When the memory is constructed in such a large scale as, for example, 32 kilobits, the rise in potential in the floating gate of the non-selected memory MISFET's reaches about 2 volts.

When the MISFET $Q_{30}$ which serves as resistance means is not provided, the potential in the floating gate so rises that the non-selected memory MISFET $Q_{14}$ is rendered conductive to form a leakage current path with respect to the bit line $B_1$.

According to the embodiment of the present invention, however, leakage current can be prevented from being developed in the above-mentioned path by providing the MISFET $Q_{30}$ in the common source.

Namely, the writing current flows from the writing circuit 12 to the MISFET $Q_{30}$ via the selected MISFET $Q_{10}$, and the voltage is dropped by the writing current. The voltage drop in the MISFET $Q_{30}$ causes the source potential of the memory MISFET $Q_{14}$ to be raised. Consequently, the non-selected memory MISFET $Q_{14}$ and the like can be rendered non-conductive even when the potential of the floating gate is raised.

According to the embodiment of the present invention which prevents the leakage current of the non-selected memory FET, the writing current set by the writing circuit 12 is allowed to flow to the selected memory MISFET only, in order to reliably carry out the writing operation.

The threshold voltage of the memory MISFET which is selected responsive to the rise in the potential of the common source, is also increased substantially. However, since the high voltage of 25 volts is applied to the control gate, the turn-on operation or the operation for injecting electrons into the floating gate is very little affected.

In the embodiment of the present invention, furthermore, provision of reistance means in the common source of the memory MISFET's helps prevent the memory MISFET's from being destroyed.

That is, in writing the data, when the high voltage for writing is erroneously set to be greater than the withstand voltage of the memory MISFET's, the breakdown current between the drain and the substrate flows into the substrate. Ground wire is contacted to the front surface or the back surface of the substrate as mentioned earlier. Usually, however, since the substrate has a relatively large resistance, the potential in the substrate is raised by the break-down current.

Due to the rise in the substrate potential, the pn junction between the source of the MISFET or the memory MISFET and the substrate is biased in the forward direction. The biasing in the forward direction causes the source, substrate and drain of the MISFET to work as an emitter, base and collector of the parasitic bipolar transistor. Consequently, a heavy current flows across the drain and the source of the MISFET or the memory MISFET, and results in the destruction of the MISFET. According to the present invention, however, resistance means $Q_{30}$ mentioned earlier causes the source potential to be raised, and makes it possible to prevent the forward biasing between the substrate and the source. In other words, it is possible to prevent the aforementioned phenomenon of parasitic bipolar transistor.

The MISFET $Q_{30}$ which serves as resistance means and which is provided in the common source can be replaced by a resistor as mentioned earlier. Even in this case, the voltage drop across the resistor caused by the current which flows through the memory MISFET which is selected when the data is being read out, can be reduced to a practically negligibly small value provided the current which flows into the memory MISFET for reading is selected to be considerably smaller than the current which flows into the memory MISFET for writing.

However, when the gate potential of the MISFET $Q_{30}$ which is used as resistance means is to be controlled, the memory device can be so constructed that the reading operation is not substantially affected by a resistance means which is inserted for effecting the writing operation.

The present invention is in no way limited to the above-mentioned embodiment only. For example, all of the common source lines may be commonly connected at one place as shown in FIG. 2, and the above-mentioned resistance means may be provided for the individual common source lines. Furthermore, resistance means may be provided for a group of common source lines. Moreover, the circuit for switching the level of signals for selecting the word lines W and bit lines B when the data is to be written down or read out, the X-address and Y-address decoder circuits, and the writing and reading amplifiers, can be suitably modified.

What is claimed is:

1. A programmable read only memory comprising: a bit line; a common source line; a plurality of word lines; word line selection means; writing voltage generator means which applies a writing voltage to said bit line; a plurality of memory insulated gate field effect transistors, each having a control gate connected to a corresponding word line, a floating gate, a drain commonly connected to said bit line, and a source commonly connected to said common source line, an electric charge which serves as writing data being injected into the floating gate of selected insulated gate field effect transistors when the writing voltage and a word line selection voltage are fed to the drain and control gate thereof; and source voltage generator means which applies a predetermined voltage to said common source line, said predetermined voltage having a level which causes insulated gate field effect transistors which are not selected to be non-conductive when the writing voltage and the word line section voltage are fed to a selected insulated gate field transistor through said bit line and one of said word lines by preventing a leakage current from flowing from said bit line to the non-selected insulated gate field effect transistors.

2. A programmable read only memory according to claim 1, wherein said source voltage generator means comprises a resistor element which is connected between said common source line and ground point of the circuit.

3. A programmable read only memory according to claim 1, wherein said source voltage generator means comprises an insulated gate field effect transistor which is connected between said common source line and ground point of the circuit.

4. A programmable read only memory according to claim 1, wherein said source voltage generator means comprises a variable resistor which is connected between said common source line and ground point of the circuit, which assumes a relatively high resistance when the data is to be written on said insulated gate field effect transistor for memory, and which assumes a relatively low resistance when the data is to be read from said insulated gate field effect transistor for memory.

5. A programmable read only memory according to claim 4, wherein said variable resistor means, comprises an insulated gate field effect transistor of the depletion mode type.

6. A programmable read only memory comprising: a plurality of insulated gate field effect transistors for memory, each having a control gate connected to a corresponding word line, a floating gate, a drain commonly connected to a first bit line, and a source connected to a common source line, an electric charge which serves as writing data being injected into the floating gate of selected insulated gate field transistors when a writing voltage and a word line selection voltage are fed to the drain and the control gate thereof; a plurality of insulated gate field effect transistors for memory, each having a control gate connected to said corresponding word line, a floating gate, a drain commonly connected to a second bit line, and a source commonly connected to said common source line, an electric charge which serves as writing data being injected into the floating gate of selected insulated gate field effect transistors when the writing voltage and the word line selection voltage are fed to the drain and the control gate thereof; word line selection means; bit line selection means; writing voltage generator means which applies the writing voltage to said insulated gate field effect transistors via said bit line selection means; and source voltage generator means which applies a predetermined voltage to said common source line, said predetermined voltage having a level which causes insulated gate field effect transistors which are not selected to be non-conductive when the writing voltage and the word line selection voltage are fed to a selected insulated gate field effect transistor through one of said bit lines and one of said word lines by preventing a leakage current from flowing from said one of said bit lines to the non-selected insulated gate field effect transistors.

7. A programmable read only memory comprising: a plurality of insulated gate field effect transistors for memory, each having a control gate connected to a corresponding word line, a floating gate, a drain commonly connected to a first bit line, and a source commonly connected to a first common source line, an electric charge which serves a writing data being injected into the floating gate of selected insulated gate field effect transistors when the writing voltage and the word line selection voltage are fed to the drain and the control gate thereof; word line selection means; bit line selection means; writing voltage generator means which applies the writing voltage to said insulated gate field effect transistors for memory via said bit line selection means; and source voltage generator means which commonly applies a predetermined voltage to said first and second common source lines, said predetermined voltage having a level which causes insulated gate field effect transistors which are not selected to be non-conductive when the writing voltage and the word line selection voltage are fed to a selected insulated gate field effect transistor through one of said bit lines and one of said word lines by preventing a leakage current from flowing from said one of said bit lines to the non-selected insulated gate field effect transistors.

8. A programmable read only memory comprising: a bit line; a common source line; a plurality of word lines; word line selection means; writing voltage generator means which applies a writing voltage to said bit line; a plurality of memory insulated gate field effect transistors, each having a control gate connected to a corresponding word line, a floating gate, a drain commonly connected to said bit line, and a source commonly connected to said common source line, an electric charge which serves as writing data being injected into the floating gate of selected insulated gate field effect transistors when the writing voltage and a word line selection voltage are fed to the drain and control gate thereof; and means coupled to said common source line for preventing a leakage current from flowing from said bit line to insulated gate field effect transistors which are not selected when the writing voltage and the word line selection voltage are fed to a selected insulated gate field effect transistor through said bit line and one of said word lines so that said non-selected insulated gate field effect transistors are non-conductive.

9. A programmable read only memory according to claim 8, wherein said leakage current preventing means comprises a voltage generator for holding said common source line at a predetermined potential sufficient for preventing said leakage current.

* * * * *